United States Patent
Yang (10) Patent No.: US 10,659,765 B2
(45) Date of Patent: May 19, 2020

(54) THREE-DIMENSIONAL (3D) IMAGE SYSTEM AND ELECTRONIC DEVICE

(71) Applicant: Shenzhen Goodix Technology Co., Ltd., Shenzhen, Guangdong (CN)

(72) Inventor: Meng-Ta Yang, Taipei (TW)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 92 days.

(21) Appl. No.: 15/959,272

(22) Filed: Apr. 22, 2018

(65) Prior Publication Data

US 2019/0052863 A1 Feb. 14, 2019

Related U.S. Application Data

(63) Continuation of application No. PCT/CN2017/097332, filed on Aug. 14, 2017.

(51) Int. Cl.
| | |
|---|---|
| *H04N 13/254* | (2018.01) |
| *G01B 11/25* | (2006.01) |
| *G01S 17/89* | (2020.01) |
| *H04N 5/378* | (2011.01) |
| *H04N 5/3745* | (2011.01) |
| *G06T 7/521* | (2017.01) |
| *H04N 5/225* | (2006.01) |

(52) U.S. Cl.
CPC ....... *H04N 13/254* (2018.05); *G01B 11/2509* (2013.01); *G01B 11/2531* (2013.01); *G01B 11/2536* (2013.01); *G01S 17/89* (2013.01); *G06T 7/521* (2017.01); *H04N 5/2256* (2013.01); *H04N 5/378* (2013.01); *H04N 5/3745* (2013.01); *G06T 2207/10028* (2013.01); *G06T 2207/10052* (2013.01)

(58) Field of Classification Search
CPC .... H04N 13/254; H04N 5/2256; H04N 5/378; H04N 5/3745; H04N 5/37452; H04N 5/35572; G01B 11/2531; G01B 11/2536; G01B 11/2509; G01B 11/00; G06T 7/521; G06T 2207/10052; G06T 2207/10028; G01S 17/89
See application file for complete search history.

(56) References Cited

U.S. PATENT DOCUMENTS

| | | |
|---|---|---|
| 9,154,708 B1 | 10/2015 | Rivard |
| 2005/0206777 A1 | 9/2005 | Selves |
| 2010/0074532 A1 | 3/2010 | Gordon |

(Continued)

FOREIGN PATENT DOCUMENTS

| | | |
|---|---|---|
| CN | 101356450 A | 1/2009 |
| CN | 101520326 A | 9/2009 |

(Continued)

*Primary Examiner* — Gevell V Selby
(74) *Attorney, Agent, or Firm* — Winston Hsu (57) ABSTRACT

The present application provides a three-dimensional (3D) image system, comprising a structural light module, configured to emit a structural light, wherein the structural light module comprises a first light-emitting unit, the first light-emitting unit receives a first pulse signal and emits a first light according to the first pulse signal, a duty cycle of the first pulse signal is less than a specific value, an emission power the first light-emitting unit is greater than a specific power, and the first light has a first wavelength; and a light-sensing pixel array, configured to receive a reflected light corresponding to the structural light.

18 Claims, 12 Drawing Sheets

(56) References Cited

U.S. PATENT DOCUMENTS

| | | | |
|---|---|---|---|
| 2011/0085043 A1* | 4/2011 | Kamiyama | H04N 5/332 348/164 |
| 2011/0090385 A1* | 4/2011 | Aoyama | H04N 5/2354 348/308 |
| 2013/0229491 A1* | 9/2013 | Kim | G06F 1/3265 348/46 |
| 2015/0116601 A1 | 4/2015 | Wang | |
| 2015/0271476 A1* | 9/2015 | Wan | H04N 5/37452 348/46 |
| 2015/0341619 A1 | 11/2015 | Meir | |
| 2016/0109575 A1* | 4/2016 | Oggier | G01S 17/89 356/5.01 |

FOREIGN PATENT DOCUMENTS

| | | |
|---|---|---|
| CN | 101604111 A | 12/2009 |
| CN | 101627280 A | 1/2010 |
| CN | 102547305 A | 7/2012 |
| CN | 102595030 A | 7/2012 |
| CN | 103400366 A | 11/2013 |
| CN | 103712576 A | 4/2014 |
| CN | 104134426 A | 11/2014 |
| CN | 104266607 A | 1/2015 |
| CN | 104597967 A | 5/2015 |
| CN | 104717408 A | 6/2015 |
| CN | 105705962 A | 6/2016 |
| CN | 106094398 A | 11/2016 |
| CN | 106289092 A | 1/2017 |
| CN | 107024850 A | 8/2017 |
| EP | 2500687 A2 | 9/2012 |
| JP | 2011-169701 A | 9/2011 |
| JP | 2013-213812 A | 10/2013 |
| JP | 2016-524709 A | 8/2016 |
| KR | 10-2009-0097416 A | 9/2009 |
| TW | 399742 U | 7/2000 |
| TW | 201132925 A1 | 10/2011 |
| TW | 201629444 A | 8/2016 |

* cited by examiner

THREE-DIMENSIONAL (3D) IMAGE SYSTEM AND ELECTRONIC DEVICE

CROSS REFERENCE TO RELATED APPLICATIONS

The present application is a continuation of international application No. PCT/CN2017/097332, filed on Aug. 14, 2017, of which are incorporated herein by reference in its entirety.

FIELD OF THE INVENTION

The present application relates to a three-dimensional (3D) image system and an electronic device, and more particularly, to a 3D image system and an electronic device capable of withstanding ambient light.

BACKGROUND

With the rapid development of science and technology, obtaining three-dimensional (3D) information of the object has been applied in a wide range of applications, such as human-computer interaction, 3D printing, reverse engineering, 3D reconstruction artifacts. The 3D structured light measuring technology, as a non-contact 3D information acquisition technology, due to its simple, fast and high precision, has been widely used.

Basic idea of the 3D structured light measuring method is to use the projection of the structured light and its geometry relationship to obtain the 3D information of an object. Firstly, a projecting device is used to project a coded structural light pattern onto the object, and a camera is used to capture the projected image. Secondly, matching between the captured image and the structural light pattern is performed, and a matching point is obtained. Finally, the 3D information is solved according to the triangular relationship of the projecting point, the matching point and the object.

However, the structural light in the prior art is easily to be interfered by the ambient light, and an accuracy of the 3D information is degraded. Therefore, it is necessary to improve the prior art.

SUMMARY

It is therefore a primary objective of the present application to provide a 3D image system and an electronic device capable of withstanding ambient light, to improve over disadvantages of the prior art.

To solve the problem stated in the above, an embodiment of the present application provides a three-dimensional (3D) image system, comprising a structural light module, configured to emit a structural light, wherein the structural light module comprises a first light-emitting unit, the first light-emitting unit receives a first pulse signal and emits a first light according to the first pulse signal, a duty cycle of the first pulse signal is less than a specific value, an emission power the first light-emitting unit is greater than a specific power, and the first light has a first wavelength; and a light-sensing pixel array, configured to receive a reflected light corresponding to the structural light.

For example, the duty cycle of the first pulse signal is less than $1/50$.

For example, the emission power of the first light-emitting unit is greater than 4 watts.

For example, the structural light module comprises a diffraction unit, and the diffraction unit forms a diffraction effect on the first light and generates the structural light.

For example, the diffraction unit is a diffraction optical element.

For example, the light-sensing pixel array comprises a plurality of light-sensing pixel circuits, and a light-sensing pixel circuit of the plurality of light-sensing pixel circuits comprises a light-sensing component; a first photoelectric readout circuit, coupled to the light-sensing component, configured to output a first output signal; and a second photoelectric readout circuit, coupled to the light-sensing component, configured to output a second output signal; wherein a pixel value corresponding to the light-sensing pixel circuit is a subtraction result of the first output signal and the second output signal.

For example, the first photoelectric readout circuit comprises a first transmission gate, coupled to the light-sensing component; a first output transistor, coupled to the first transmission gate; and a first read transistor, coupled to the first output transistor, configured to output the first output signal; and the second photoelectric readout circuit comprises a second transmission gate, coupled to the light-sensing component; a second output transistor, coupled to the second transmission gate; and a second read transistor, coupled to the second output transistor, configured to output the second output signal.

For example, the first transmission gate is conducted when the first light-emitting unit emits light, the second transmission gate is conducted when the first light-emitting unit does not emit light, and a conduction time interval of the first transmission gate is longer than an emitting time interval of the first light-emitting unit.

For example, the light-sensing pixel circuit comprises a first reset transistor and a second reset transistor, the first reset transistor is coupled to the first transmission gate, and the second reset transistor is coupled to the second transmission gate.

For example, the duty cycle of the first pulse signal is time variant.

For example, the structural light module comprises at least a second light-emitting unit, the at least a second light-emitting unit receives at least a second pulse signal and emits at least a second light according to the at least a second pulse signal, a duty cycle of the at least a second pulse signal is less than the specific value, an emission power of the at least a second light-emitting unit is greater than the specific power, and the at least a second light has at least a second wavelength, respectively.

For example, the light-sensing pixel array comprises a plurality of light-sensing pixel circuits, and a light-sensing pixel circuit of the plurality of light-sensing pixel circuits comprises a light-sensing component; a first photoelectric readout circuit, coupled to the light-sensing component, configured to output a first output signal; at least a second photoelectric readout circuit, coupled to the light-sensing component, configured to output at least a second output signal; and a third photoelectric readout circuit, coupled to the light-sensing component, configured to output a third output signal; where a pixel value corresponding to the light-sensing pixel circuit is a sum of the first output signal and the at least a second output signal minus a product of the third output signal and a number of the first output signal and the at least a second output signal.

For example, the first photoelectric readout circuit comprises a first transmission gate, coupled to the light-sensing component; a first output transistor, coupled to the first transmission gate; and a first read transistor, coupled to the first output transistor, configured to output the first output signal; a second photoelectric readout circuit of the at least a second photoelectric readout circuit comprises a second transmission gate, coupled to the light-sensing component; a second output transistor, coupled to the second transmission gate; and a second read transistor, coupled to the second output transistor, configured to output the second output signal; and the third photoelectric readout circuit comprises a third transmission gate, coupled to the light-sensing component; a third output transistor, coupled to the third transmission gate; and a third read transistor, coupled to the third output transistor, configured to output the third output signal.

For example, the first transmission gate is conducted when the first light-emitting unit emits light, the at least a second transmission gate of the at least a second photoelectric readout circuit is conducted when the at least a second light-emitting unit emits light, the third transmission gate is conducted when the first light-emitting unit and the at least a second light-emitting unit do not emit light, a conduction time interval of the first transmission gate is longer than an emitting time interval of the first light-emitting unit, and an conduction time interval of the at least a second transmission gate is longer than an emitting time interval of the at least a second light-emitting unit.

For example, the light-sensing pixel circuit comprises a first reset transistor, at least a second reset transistor and a third reset transistor, the first reset transistor is coupled to the first transmission gate, the at least a second reset transistor is coupled to the at least a second transmission gate of the at least a second photoelectric readout circuit, and the third reset transistor is coupled to the third transmission gate.

For example, a time in which the first transmission gate is conducted and a time in which the second transmission gate is conducted are separated by a time blank.

For example, the first wavelength and the at least a second wavelength are different.

For example, the duty cycles of the first pulse signal and the at least a second pulse signal are time variant.

The light-emitting unit within the structural light module of the present application receives the pulse signal, which is pulse modulated, and emits instantaneous strong light, such that the emitted structural light has immunity against the ambient light, to improve over disadvantages of the prior art.

DETAILED DESCRIPTION

In order to make the objects, technical solutions and advantages of the present invention become more apparent, the following relies on the accompanying drawings and embodiments to describe the present invention in further detail. It should be understood that the specific embodiments described herein are only for explaining the present invention and are not intended to limit the present invention.

Figure 1:
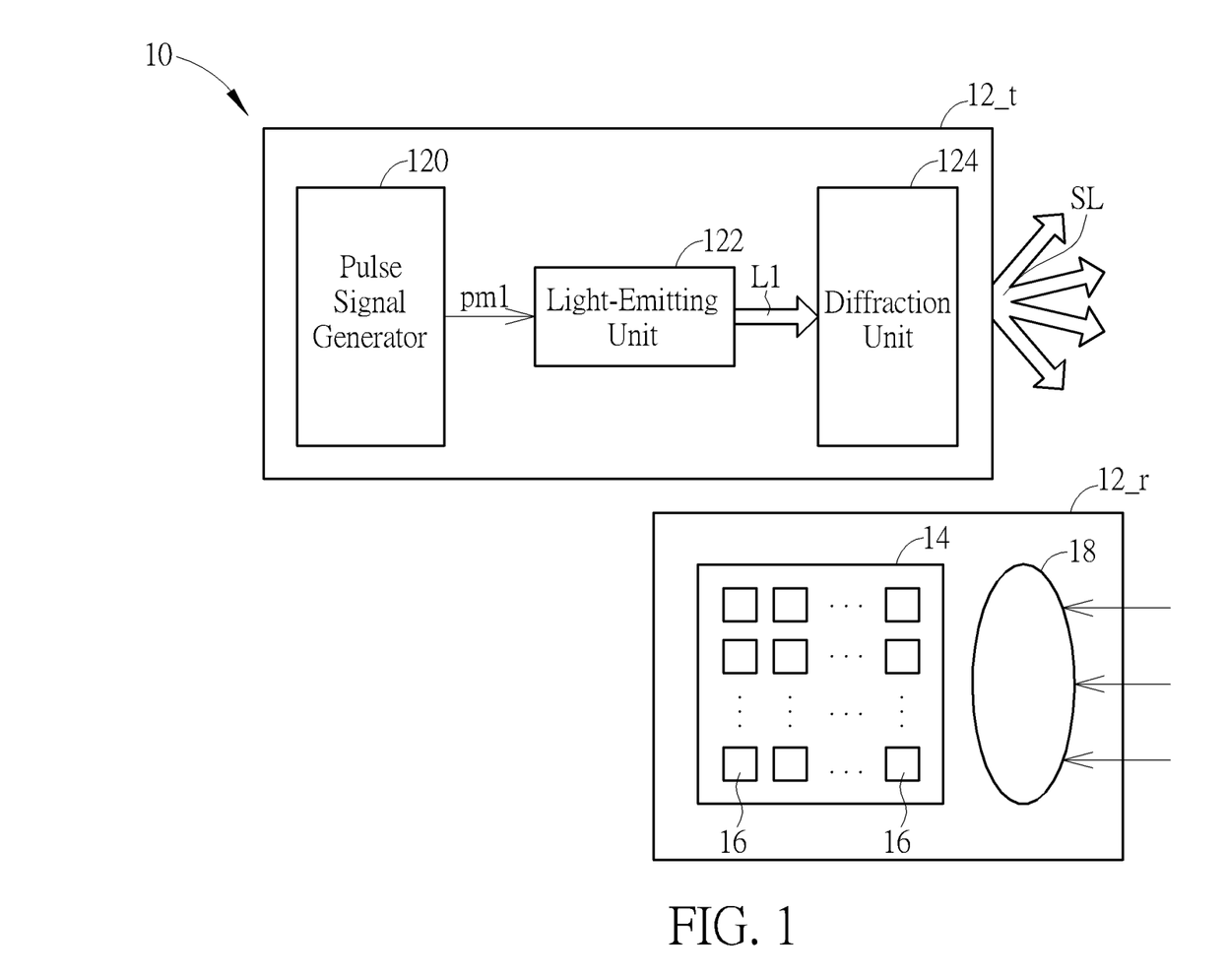
FIG. 1 is a schematic diagram of three-dimensional (3D) image system according to an embodiment of the present application.
Figure 7:
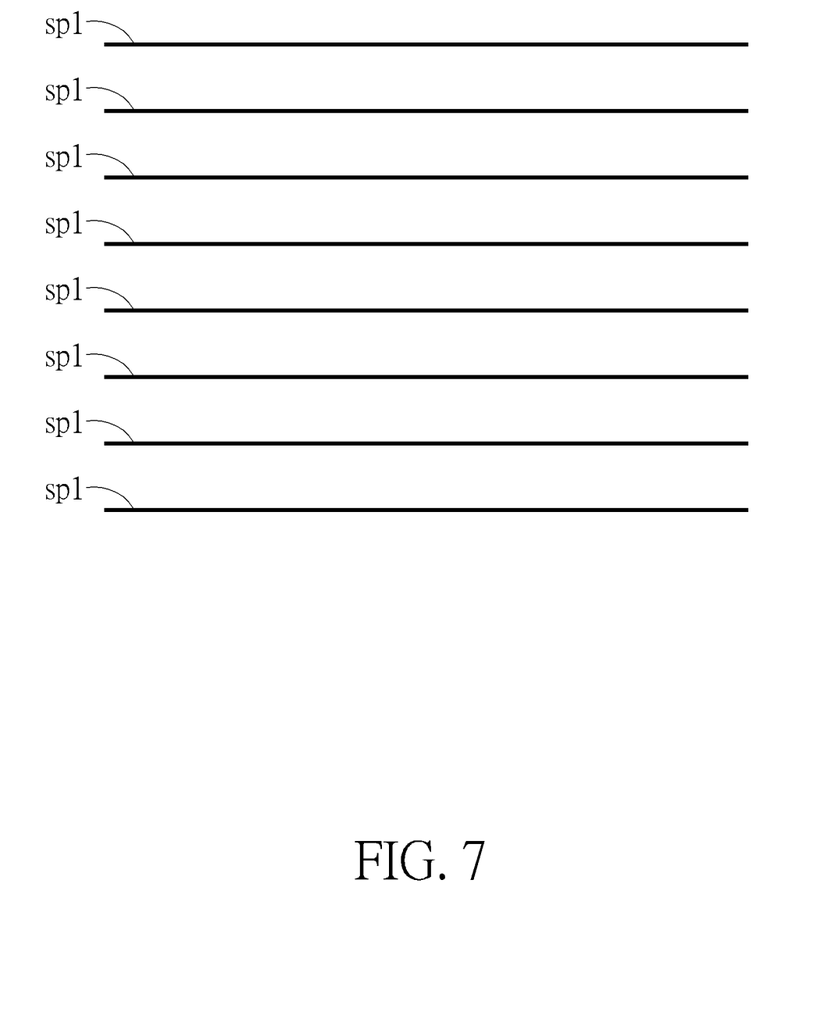
FIG. 7 is a schematic diagram of a structural light according to an embodiment of the present application.

To solve the problem of the structural light in the prior art being easily to be interfered by the ambient light, the present application utilizes a pulse modulated signal to generate the structural light. Specifically, please refer to FIG. 1. FIG. 1 is a schematic diagram of a three-dimensional (3D) image system 10 according to an embodiment of the present application. The 3D image system 10 comprises a structural light module 12_t and a camera module 12_r. The structural light module 12_t is configured to generate a structural light SL, and project the structural light SL onto an object, where the structural light SL has stripe pattern, as shown in FIG. 7. The camera module 12_r may capture an image of the structural light SL projected onto the object, and calculate depth information of the object (using the triangular measuring method) according to curveness of the structural light SL on the object, so as to obtain a 3D image related to the object.

Specifically, the structural light module 12_t comprises a pulse signal generator 120, a light-emitting unit 122 and a diffraction unit 124. The light-emitting unit 122 may be a light-emitting diode (LED) or a laser emitting unit. The diffraction unit 124 may be a diffraction optical element (DOE). The pulse signal generator 120 is configured to generate a pulse signal pm1. The light-emitting unit 122 is coupled to the pulse signal generator 120, to receive the pulse signal pm1 and generate/emit a first light L1 to the diffraction unit 124 according to the pulse signal pm1. Diffraction effect would be formed on the first light L1 in the diffraction unit 124, and the structural light SL is generated. Moreover, the pulse signal pm1 is a pulse modulated signal, i.e., the pulse signal pm1 may be regarded as square waves with small duty cycle. In addition, when the light-emitting unit 122 emits the first light L1, the light-emitting unit 122 would have a large emission power. Specifically, a duty cycle of the pulse signal pm1 may be 1/1000 in general, and not limited herein. As long as the duty cycle of the pulse signal pm1 is less than 1/50, requirements of the present application are satisfied. In addition, an emission power of the light-emitting unit 122 is between 4 watts and 5 watts in general, and not limited herein. As long as the emission power of the light-emitting unit 122 is greater than 4 watts, requirements of the present application are satisfied. In other words, the light-emitting unit 122 may be regarded as emitting a strong light instantaneously, which is similar to a photoflash of a general camera), so as to enhance a light signal strength related to the structural light SL received by the camera module 12_r, such that the light signal related to the structural light SL has immunity against the ambient light, to improve over disadvantages of the prior art.

Figure 2:
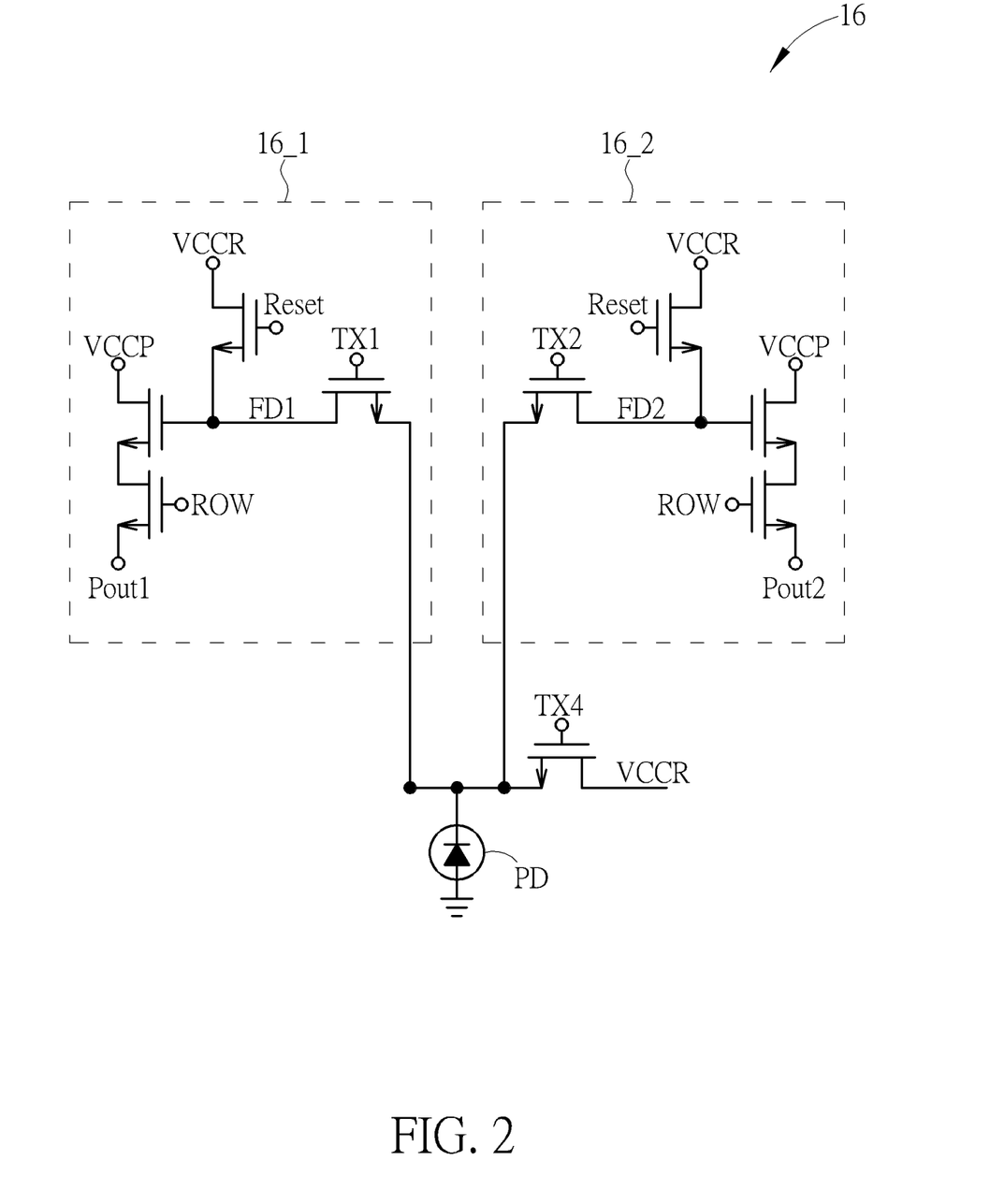
FIG. 2 is a schematic diagram of a light-sensing pixel circuit according to an embodiment of the present application.
Figure 3:
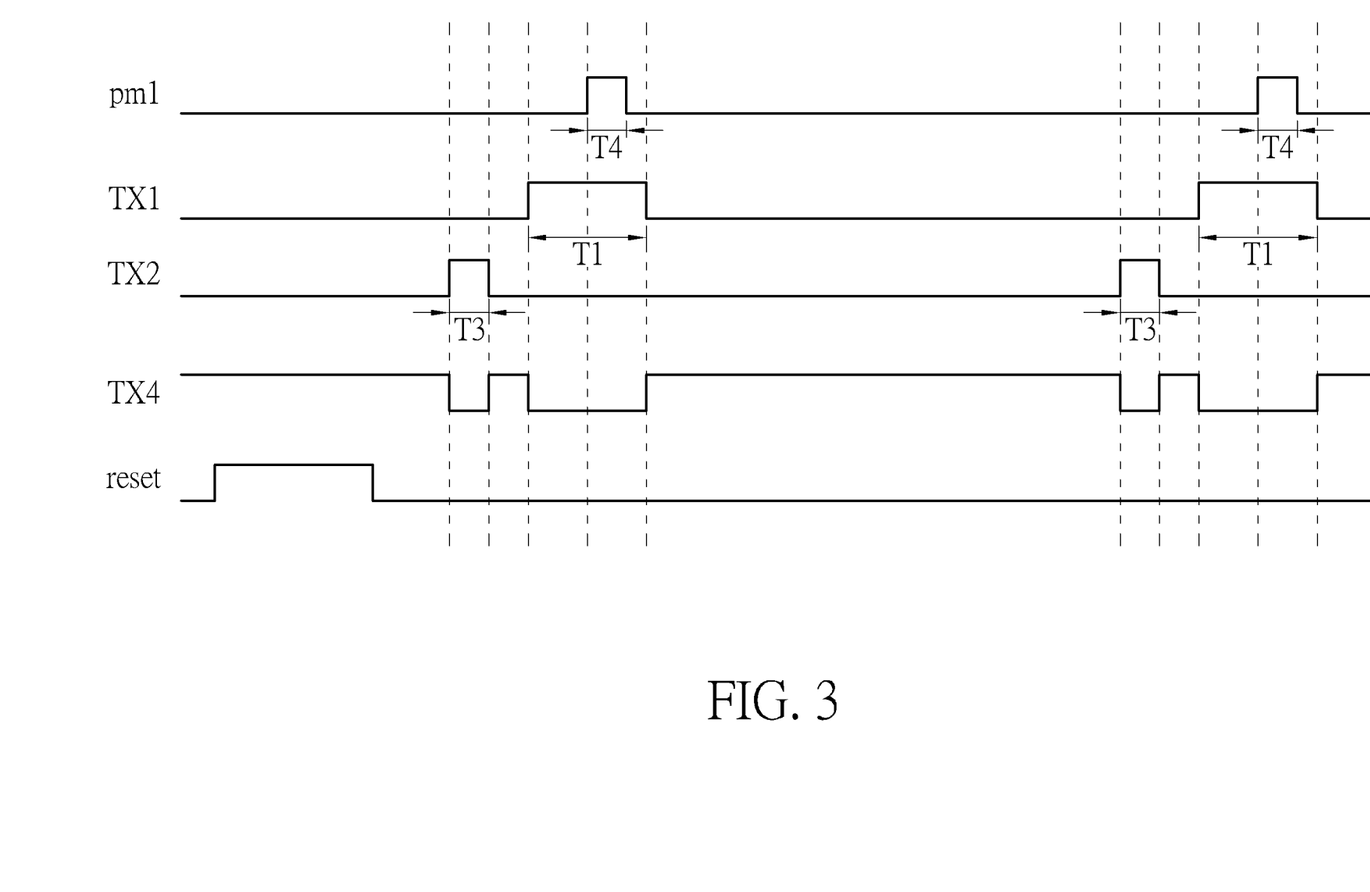
FIG. 3 is a timing diagram of the light-sensing pixel circuit in FIG. 2.

In another perspective, the camera module 12_r includes a light-sensing pixel array 14 and a lens 18. The light-sensing pixel array 14, receiving a reflected light corresponding to the structural light SL, comprises a plurality of light-sensing pixel circuits 16. The output signals of the light-sensing pixel circuits 16 may correspond to pixel values of the image captured by the camera module 12_r. The circuit structure and operational mechanism of the light-sensing pixel circuit 16 are not limited. For example, please refer to FIG. 2 and FIG. 3. FIG. 2 is an equivalent schematic circuit diagram of the light-sensing pixel circuit 16 according to an embodiment of the present application. FIG. 3 is a timing diagram of the light-sensing pixel circuit 16. The light-sensing pixel circuit 16 comprises a light-sensing component PD and photoelectric readout circuits 16_1, 16_2. Both the photoelectric readout circuits 16_1 and 16_2 include transmission gates, reset transistors, output transistors and read transistors. The transmission gates are coupled to the light-sensing component PD. Gates of the reset transistors receive a reset signal Reset. Gates of the read transistors receive a row select signal ROW. The transmission gates of the photoelectric readout circuits 16_1 and 16_2 receive signals TX1 and TX2, respectively. The transmission gate, the reset transistor and the output transistor of the photoelectric readout circuit 16_1 are connected to a node FD_1. The transmission gate, the reset transistor and the output transistor of the photoelectric readout circuit 16_2 are connected to a node FD_2. In addition, the light-sensing pixel circuit 16 also includes an anti-blooming transistor, and a gate of the anti-blooming transistor receives a signal TX4.

Operational mechanism of the light-sensing pixel circuit 16 is described as follows. When the pulse signal pm1 is high, the light-emitting unit 122 emits the first light L1. When the light-emitting unit 122 emits the first light L1, the transmission gate of the photoelectric readout circuit 16_1 is conducted. In an embodiment, a conduction time interval T1 of the transmission gate within the photoelectric readout circuit 16_1 is wider than a time interval T4 of the pulse signal pm1 being high, i.e., the conduction time interval of the transmission gate within the photoelectric readout circuit 16_1 is longer than an emitting time interval of the light-emitting unit 122. When the transmission gate of the photoelectric readout circuit 16_1 is conducted (i.e., the signal TX1 is high), i.e., within the conduction time interval T1, the light-sensing component PD receives the first light L1 and the ambient light, and the transmission gate of the photoelectric readout circuit 16_1 may drain out the photocharge generated by the light-sensing component PD because of receiving the first light L1 and also the ambient light and store the photocharge at the node FD_1. In another perspective, when the light-emitting unit 122 does not emit light (i.e., the pulse signal pm1 is low), the transmission gate of the photoelectric readout circuit 16_2 may be conducted in a short time (the signal TX2 is high). At this time, the light-sensing component PD receives the ambient light only, and the transmission gate of the photoelectric readout circuit 16_2 may drain out the photocharge generated by the light-sensing component PD because of receiving the ambient light and store the photocharge at the node FD_2. When the read transistors of the photoelectric readout circuits 16_1 and 16_2 are conducted, the read transistor the photoelectric readout circuit 16_1 outputs an output signal Pout1 (which is related to the first light L1 and the ambient light), and the read transistor of the photoelectric readout circuit 16_2 outputs an output signal Pout2 (which is related to the ambient light only). The pixel value corresponding to the light-sensing pixel circuit 16 is a subtraction result of the output signal Pout1 and the output signal Pout2 (e.g., Pout1-Pout2). Therefore, an effect of the ambient light may be eliminated in the pixel value of the light-sensing pixel circuit 16. In addition, when the transmission gates of the photoelectric readout circuits 16_1 and 16_2 are not conducted, the anti-blooming transistor of the light-sensing pixel circuit 16 is conducted (the signal TX4 is high). The light-sensing pixel circuit 16 would drain out the photocharge of the light-sensing component PD caused by receiving the ambient light, to maintain normal operation.

After the light-emitting unit 122 emits the instantaneous strong light, it requires a time for the light-emitting unit 122 to rest, and then the light-emitting unit 122 is able to emit light again. That is, the duty cycle of the pulse signal pm1 may be too small such that a light strength corresponding to the structural light SL received by the camera module 12_r is insufficient. Thus, in an embodiment, the structural light module may comprise two light-emitting units. The two light-emitting units may emit lights alternatively, so as to enhance the strength corresponding to the structural light received by the camera module 12_r. Furthermore, the two light-emitting units may emit lights with different wavelengths. Since the different wavelengths have various refractions, the structural light generated by passing through the diffraction unit may have denser stripe pattern, and resolution of the 3D image is further enhanced.

Figure 4:
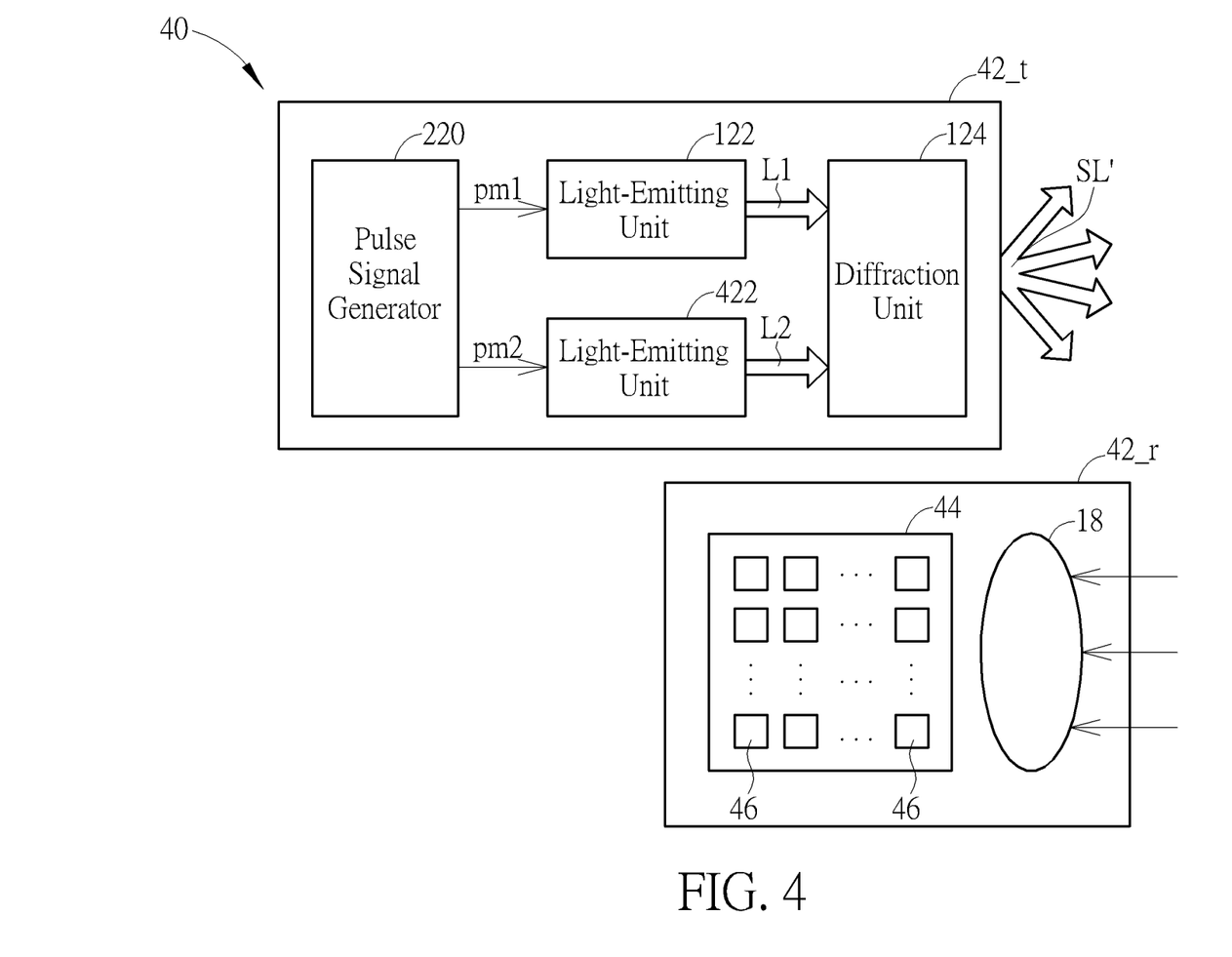
FIG. 4 is a schematic diagram of a 3D image system according to an embodiment of the present application.
Figure 8:
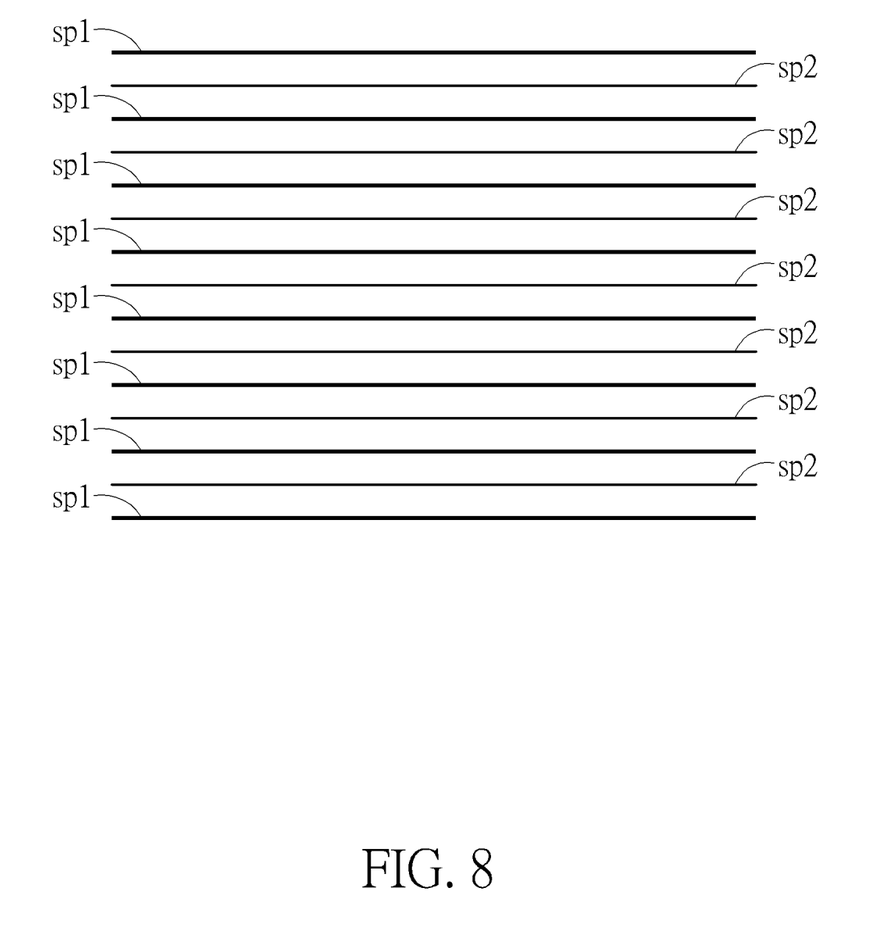
FIG. 8 is a schematic diagram of a structural light according to an embodiment of the present application.

Specifically, please refer to FIG. 4. FIG. 4 is a schematic diagram of a 3D image system 40 according to an embodiment of the present application. The 3D image system 40 is similar to the 3D image system 10, and thus, same components are denoted by the same symbols. Different from the 3D image system 10, the structural light module 42_t of the 3D image system 40 comprises another light-emitting unit 422, in addition to the light-emitting unit 122. The light-emitting unit 422 receives a pulse signal pm2 to generate a second light L2. The second light L2 and the first light L1 may have different wavelengths. Similarly, a duty cycle of the pulse signal pm2 may be 1/1000 (or less than 1/50). An emission power of the light-emitting unit 422 may be between 4 watts and 5 watts (or greater than 4 watts). In addition, the first light L1 and the second light L2 pass though the diffraction unit 124, in which the diffraction effect is formed, such that a structural light SL' is generated. Since the first light L1 and the second light L2 have the different wavelengths, the stripe pattern of the structural light SL' is denser. As shown in FIG. 8, a strip light sp1 represents the structural light corresponding to the first light L1, and a strip light sp2 represents the structural light corresponding to the second light L2.

Figure 5:
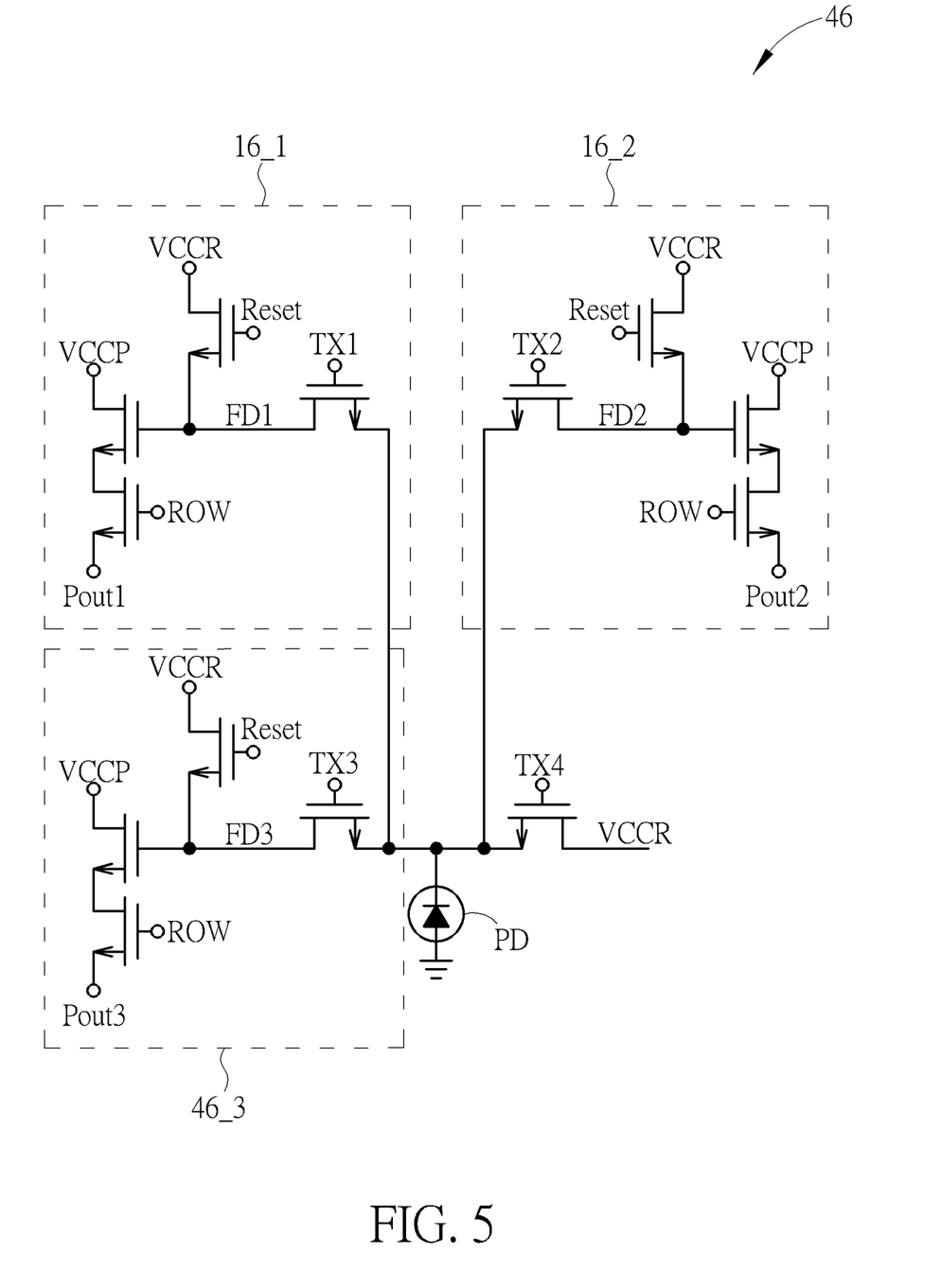
FIG. 5 is a schematic diagram of a light-sensing pixel circuit according to an embodiment of the present application.
Figure 6:
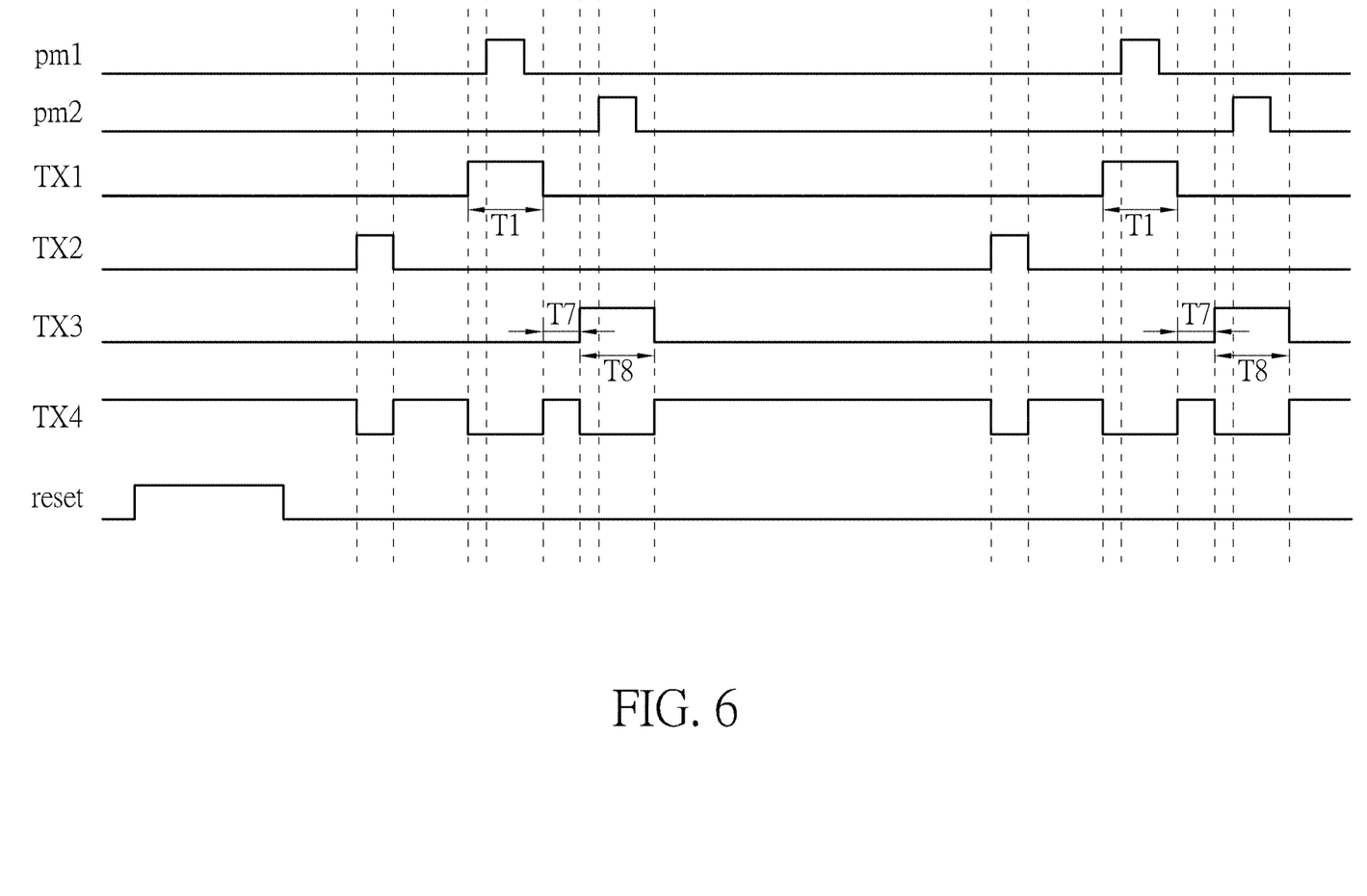
FIG. 6 is a timing diagram of the light-sensing pixel circuit in FIG. 5.

In addition, a camera module 42_r of the 3D image system 40 comprises a light-sensing pixel array 44. The light-sensing pixel array 44 comprises a plurality of light-sensing pixel circuits 46. The circuit structure and operational mechanism of the light-sensing pixel circuit 46 are not limited. For example, please refer to FIG. 5 and FIG. 6. FIG. 5 is an equivalent schematic circuit diagram of the light-sensing pixel circuit 46 according to an embodiment of the present application. FIG. 6 is a timing diagram of the light-sensing pixel circuit 46. The light-sensing pixel circuit 46 is similar to the light-sensing pixel circuit 16, and thus, same components are denoted by the same symbols. Different from the light-sensing pixel circuit 16, the light-sensing pixel circuit 46 further comprises the photoelectric readout circuit 46_3. The circuit structure of the photoelectric readout circuit 46_3 is the same as which of the photoelectric readout circuits 16_1 and 16_2, where a transmission gate of the photoelectric readout circuit 46_3 receives a signal TX3. Similarly, when the light-emitting unit 422 emits the second light L2, the transmission gate of the photoelectric readout circuit 46_3 is conducted. The light-sensing component PD receives the second light L2 and the ambient light, and the transmission gate of the photoelectric readout circuit 46_3 may drain out the photocharge generated by the light-sensing component PD because of receiving the second light L2 and the ambient light and store the photocharge a node FD_3. Similarly, when the light-emitting units 122 and 422 do not emit light (i.e., the pulse signals pm1 and pm2 are low), the transmission gate of the photoelectric readout circuit 16_2 may be conducted in a short time (the signal TX2 is high). At this time, the light-sensing component PD receives the ambient light only, and the transmission gate of the photoelectric readout circuit 16_2 may drain out the photocharge generated by the light-sensing component PD because of receiving the ambient light and store the photocharge at the node FD_2. When the read transistors of the photoelectric readout circuits 16_1, 16_2 and 46_3 are conducted, the read transistor the photoelectric readout circuit 16_1 outputs an output signal Pout1 (which is related to the first light L1 and the ambient light), the read transistor of the photoelectric readout circuit 16_2 outputs an output signal Pout2 (which is related to the ambient light only), and the read transistor of the photoelectric readout circuit 46_3 outputs an output signal Pout3 (which is related to the second light L2 and the ambient light). The pixel value corresponding to the light-sensing pixel circuit 46 is a sum of the output signal Pout1 and the output signal Pout3 minus twice of the output signal Pout2 (ie.e, Pout1+Pout3−2*Pout2), such that an effect of the ambient light may be eliminated. In addition, the conduction time intervals of the transmission gates within the photoelectric readout circuits 16_1, 16_2 are wider than pulse widths of the pulse signals pm1 and pm2, i.e., the conduction time intervals of the transmission gates within the photoelectric readout circuits 16_1, 16_2 are longer than the emitting time intervals of the light-emitting units 122, 422. In addition, the conduction time interval T1 of the transmission gate within the photoelectric readout circuit 16_1 and the conduction time interval T8 of the transmission gate within the photoelectric readout circuit 46_3 are separated by a time blank T7. The rest operational mechanism is referred to the paragraph stated in the above, which is not narrated herein for brevity.

Figure 9:
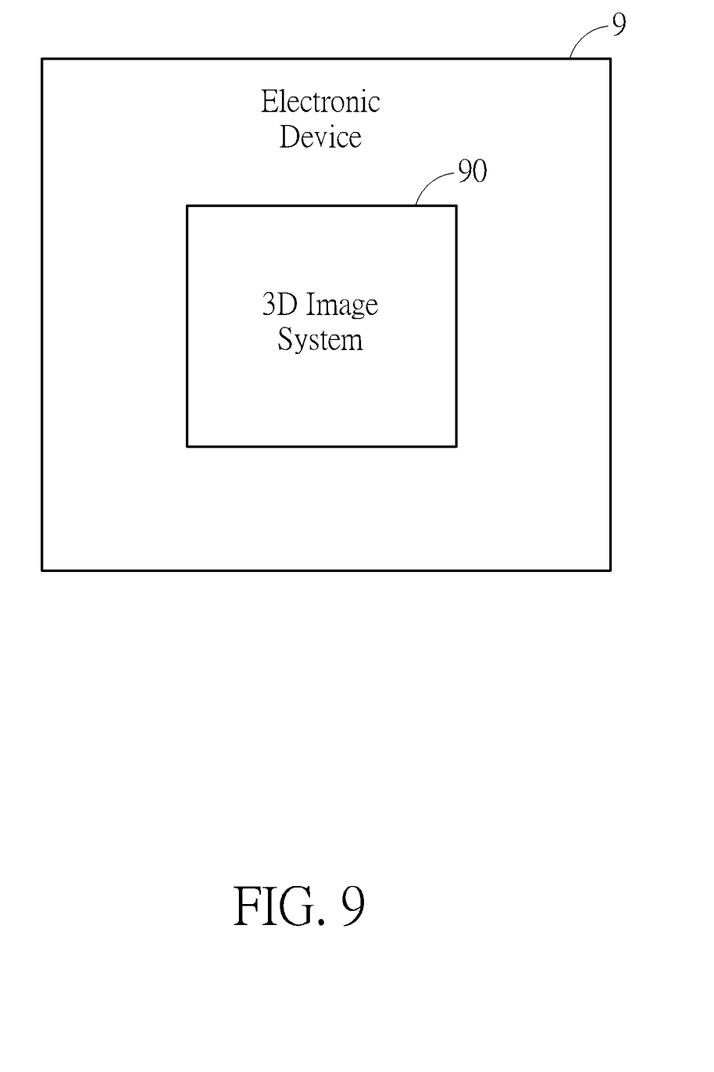
FIG. 9 is a schematic diagram of an electronic device according to an embodiment of the present application.

In addition, the 3D image system of the present application may be disposed with an electronic device. Please refer to FIG. 9. FIG. 9 is a schematic diagram of an electronic device 9 according to an embodiment of the present application. The electronic device 9 comprises a 3D image system 90, where the 3D image system 90 may be realized by the 3D image system 10 or the 3D image system 40.

Figure 12:
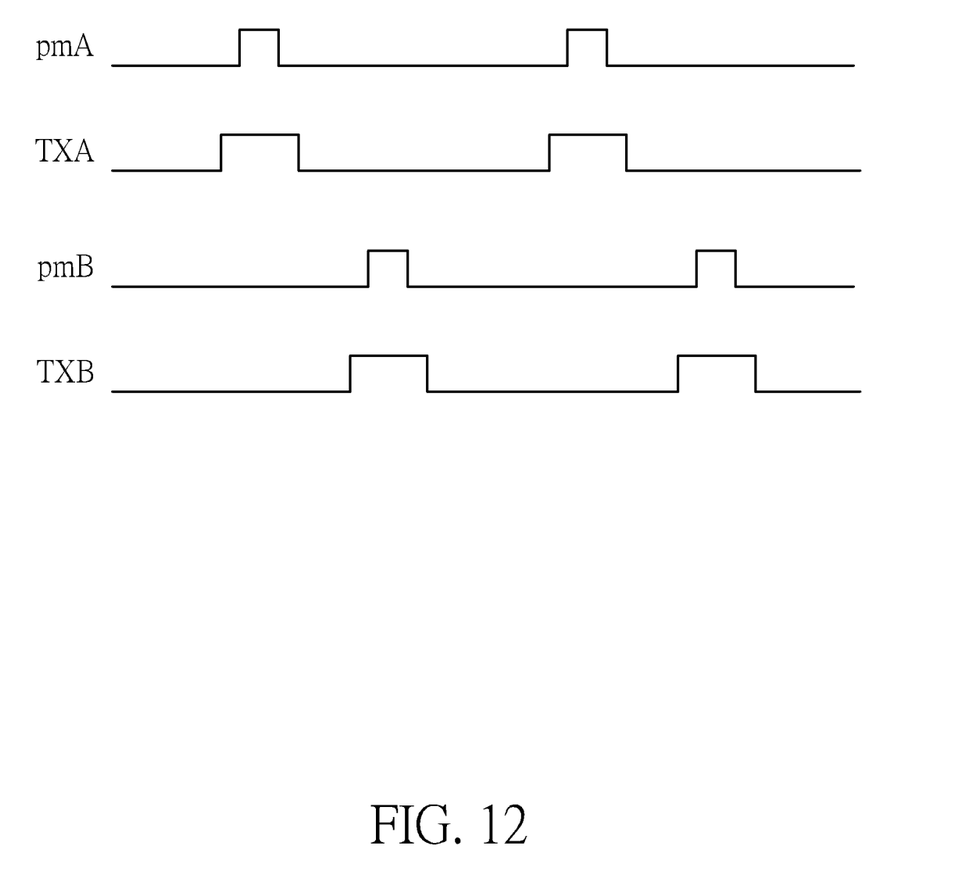
FIG. 12 illustrates waveforms of pulse signals and transmission gate signals of different electronic devices.

Notably, the embodiments stated in the above are utilized for illustrating the concept of the present invention. Those skilled in the art may make modifications and alterations accordingly, and not limited herein. For example, the duty cycles of the pulse signals pm1 and pm2 may be changed randomly (i.e., the duty cycles of the pulse signals pm1 and pm2 are time variant). For example, after the pulse signal generator 120 generates one pulse, the pulse signal generator 120 may generate a subsequent pulse (N+n) period of time later, where N may be a large integer and n may be a random number. Therefore, the structural lights corresponding to different electronic devices are prevented from interfering each other. Please refer to FIG. 12, FIG. 12 illustrates waveforms of pulse signals pmA, pmB and signals TXA, TXB of electronic devices A, B. The pulse signal pmA is the pulse signal received by the light-emitting unit within the electronic device A. The pulse signal pmB is the pulse signal received by the light-emitting unit within the electronic device B. The signal TXA is the signal received by the transmission gate within the photoelectric readout circuit of the light-sensing pixel circuit within the electronic device A. The signal TXB is the signal received by the transmission gate within the photoelectric readout circuit of the light-sensing pixel circuit within the electronic device B. As shown in FIG. 12, when the duty cycles of the pulse signals are randomly generated, the light-emitting time corresponding to the light-emitting unit of the electronic device A and which of the electronic device B would be interleaved. The conduction time corresponding to the transmission gate of the electronic device A and which of the electronic device B would be interleaved as well. Thus, the light signals related to the structural lights from the electronic device A and the electronic device B would not interfere each other.

Figure 10:
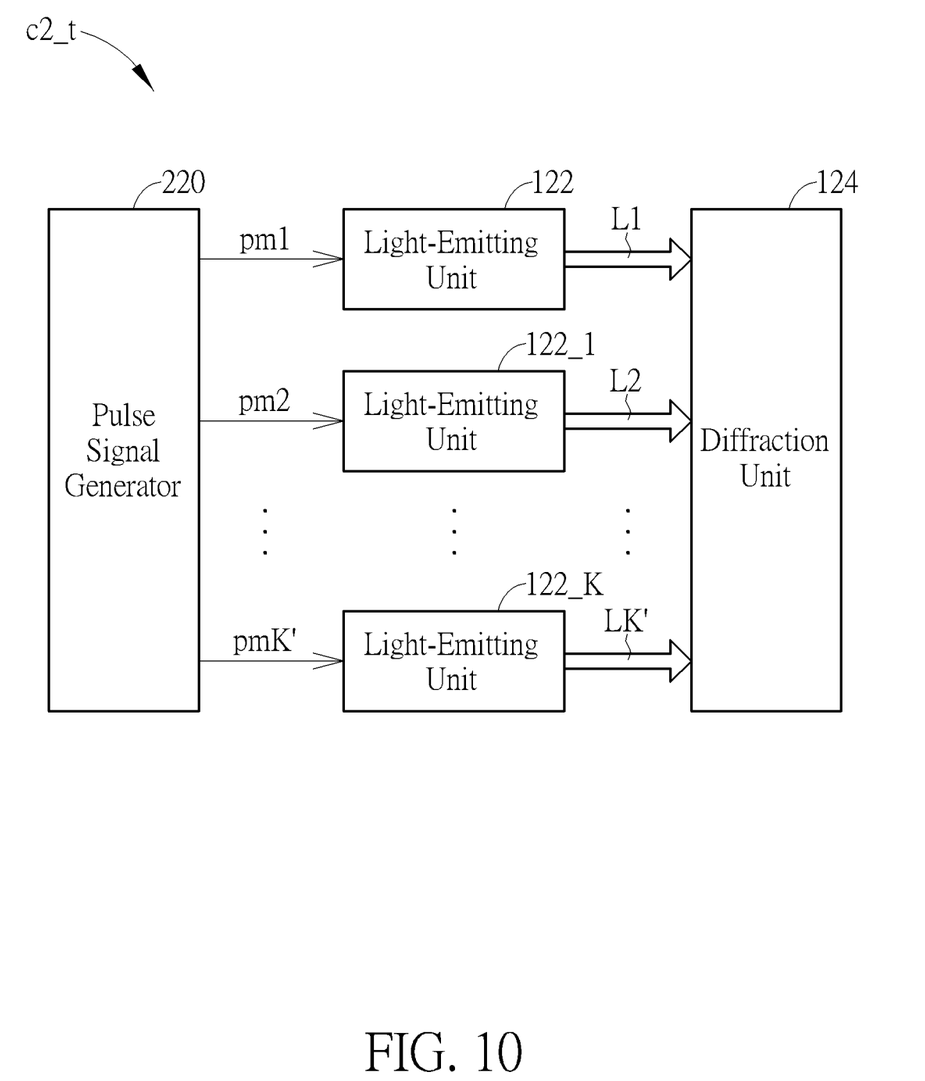
FIG. 10 is a schematic diagram of a structural light module according to an embodiment of the present application.
Figure 11:
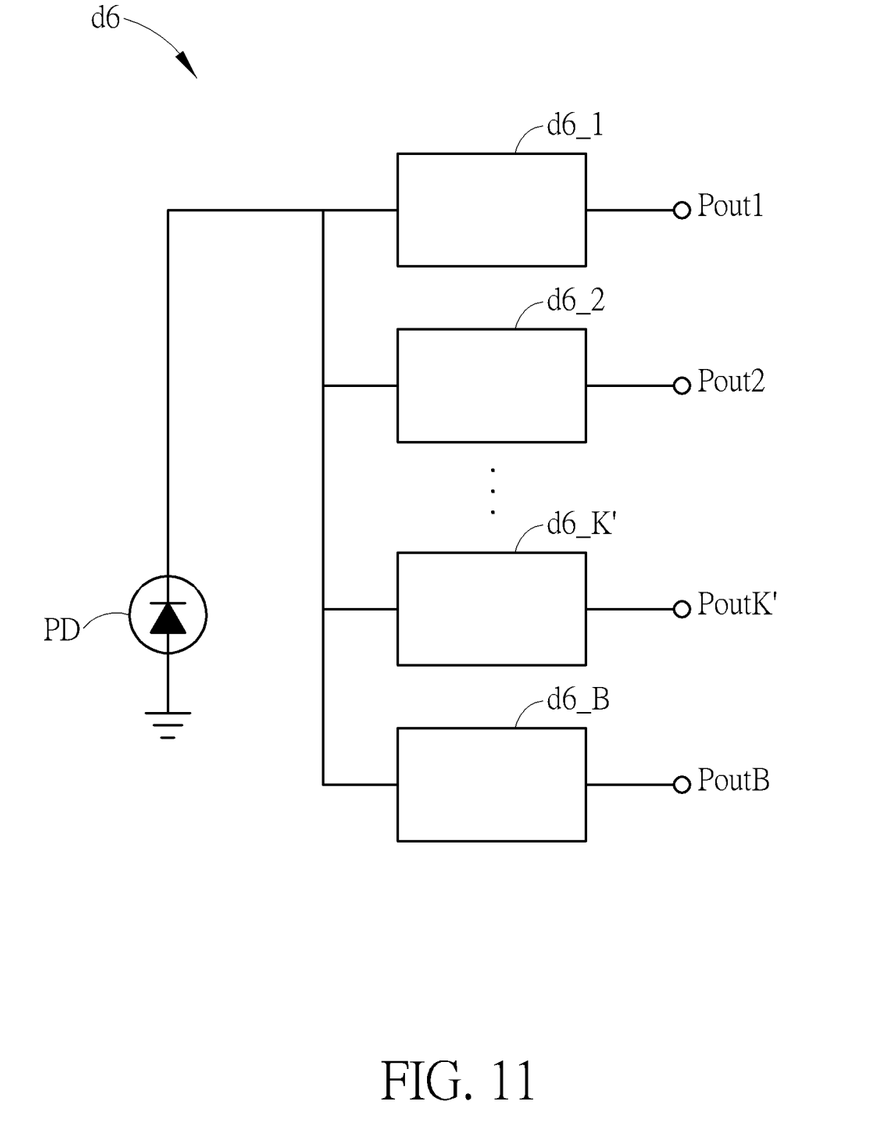
FIG. 11 is a schematic diagram of a light-sensing pixel circuit

In addition, the structural light module of the present application may comprise a plurality of light-emitting unit. Please refer to FIG. 10 and FIG. 11, FIG. 10 is a schematic diagram of a structural light module c2_t according to an embodiment of the present application. FIG. 11 is a schematic diagram of a light-sensing pixel circuit d6 corresponding to the structural light module c2_t. The structural light module c2_t comprises the light-emitting units 122 and 122_1-122_K, which emit light at different time instant. The light-sensing pixel circuit d6 comprises photoelectric readout circuits d6_1-d6_K' and d6_B. The circuit structure of the photoelectric readout circuits d6_1-d6_K' and d6_B may be the same as which of the photoelectric readout circuits 16_1, 16_2 or 46_3 stated in the above. The conduction time intervals of the transmission gate within the photoelectric readout circuits d6_1-d6_K' (K' may represent K+1) are corresponding to the emitting time intervals of the light-emitting units 122, 122_1-122_K. The photoelectric readout circuits d6_1-d6_K' output the output signals Pout1-Pout K'. The output signals Pout1-Pout K' are related to the lights emitted from the light-emitting units 122, 122_1-122_K and the ambient light. The transmission gate of the photoelectric readout circuit d6_B is conducted when all the light-emitting units 122, 122_1-122_K do not emit light, which means that the photoelectric readout circuit d6_B only reads the photocurrent caused by the ambient light, i.e., the output signal PoutB outputted by the photoelectric readout circuit d6_B is only related to the ambient light. In this case, the pixel value corresponding to the light-sensing pixel circuit d6 may be Pout1+ . . . +PoutK'−K'*PoutB.

In summary, the light-emitting unit within the structural light module of the present application receives the pulse signal, which is pulse modulated, and emits instantaneous strong light, such that the emitted structural light has immunity against the ambient light, to improve over disadvantages of the prior art.

The foregoing is only embodiments of the present application, which is not intended to limit the present application. Any modification following the spirit and principle of the present application, equivalent substitutions, improvements should be included within the scope of the present invention.

What is claimed is:

1. A three-dimensional (3D) image system, characterized by, comprising:
    a structural light module, configured to emit a structural light, wherein the structural light module comprises a first light-emitting unit, the first light-emitting unit receives a first pulse signal and emits a first light according to the first pulse signal, a duty cycle of the first pulse signal is less than a specific value, an emission power the first light-emitting unit is greater than a specific power, and the first light has a first wavelength; and a light-sensing pixel array, configured to receive a reflected light corresponding to the structural light;

wherein the light-sensing pixel array comprises a plurality of light-sensing pixel circuits, and a light-sensing pixel circuit of the plurality of light-sensing pixel circuits comprises:

a light-sensing component;

a first photoelectric readout circuit, coupled to the light-sensing component, configured to output a first output signal; and a second photoelectric readout circuit, coupled to the light-sensing component, configured to output a second output signal;

wherein a pixel value corresponding to the light-sensing pixel circuit is a subtraction result of the first output signal and the second output signal.

2. The 3D image system as claim 1, characterized in that, the duty cycle of the first pulse signal is less than 1/50.

3. The 3D image system as claim 1, characterized in that, the emission power of the first light-emitting unit is greater than 4 watts.

4. The 3D image system as claim 1, characterized in that, the structural light module comprises a diffraction unit, and the diffraction unit forms a diffraction effect on the first light and generates the structural light.

5. The 3D image system as claim 4, characterized in that, the diffraction unit is a diffraction optical element (DOE).

6. The 3D image system as claim 1, characterized in that, the first photoelectric readout circuit comprises:

a first transmission gate, coupled to the light-sensing component;

a first output transistor, coupled to the first transmission gate; and a first read transistor, coupled to the first output transistor, configured to output the first output signal; and the second photoelectric readout circuit comprises:

a second transmission gate, coupled to the light-sensing component;

a second output transistor, coupled to the second transmission gate; and a second read transistor, coupled to the second output transistor, configured to output the second output signal.

7. The 3D image system as claim 1, characterized in that, the first transmission gate is conducted when the first light-emitting unit emits light, the second transmission gate is conducted when the first light-emitting unit does not emit light, and a conduction time interval of the first transmission gate is longer than an emitting time interval of the first light-emitting unit.

8. The 3D image system as claim 1, characterized in that, the light-sensing pixel circuit comprises a first reset transistor and a second reset transistor, the first reset transistor is coupled to the first transmission gate, and the second reset transistor is coupled to the second transmission gate.

9. A three-dimensional (3D) image system, characterized by, comprising:

a structural light module, configured to emit a structural light, wherein the structural light module comprises a first light-emitting unit, the first light-emitting unit receives a first pulse signal and emits a first light according to the first pulse signal, a duty cycle of the first pulse signal is less than a specific value, an emission power the first light-emitting unit is greater than a specific power, and the first light has a first wavelength; and a light-sensing pixel array, configured to receive a reflected light corresponding to the structural light;

wherein the structural light module comprises at least a second light-emitting unit, the at least a second light-emitting unit receives at least a second pulse signal and emits at least a second light according to the at least a second pulse signal, at least a duty cycle of the at least a second pulse signal is less than the specific value, an emission power of the at least a second light-emitting unit is greater than the specific power, and the at least a second light has at least a second wavelength, respectively.

10. The 3D image system as claim 9, characterized in that, the light-sensing pixel array comprises a plurality of light-sensing pixel circuits, and a light-sensing pixel circuit of the plurality of light-sensing pixel circuits comprises:

a light-sensing component;

a first photoelectric readout circuit, coupled to the light-sensing component, configured to output a first output signal;

at least a second photoelectric readout circuit, coupled to the light-sensing component, configured to output at least a second output signal; and a third photoelectric readout circuit, coupled to the light-sensing component, configured to output a third output signal;

wherein a pixel value corresponding to the light-sensing pixel circuit is a sum of the first output signal and the at least a second output signal minus a product of the third output signal and a number of the first output signal and the at least a second output signal.

11. The 3D image system as claim 10, characterized in that, the first photoelectric readout circuit comprises:

a first transmission gate, coupled to the light-sensing component;

a first output transistor, coupled to the first transmission gate; and a first read transistor, coupled to the first output transistor, configured to output the first output signal;

a second photoelectric readout circuit of the at least a second photoelectric readout circuit comprises:

a second transmission gate, coupled to the light-sensing component;

a second output transistor, coupled to the second transmission gate; and a second read transistor, coupled to the second output transistor, configured to output the second output signal; and the third photoelectric readout circuit comprises:

a third transmission gate, coupled to the light-sensing component;

a third output transistor, coupled to the third transmission gate; and a third read transistor, coupled to the third output transistor, configured to output the third output signal.

12. The 3D image system as claim 11, characterized in that, the first transmission gate is conducted when the first light-emitting unit emits light, the at least a second transmission gate of the at least a second photoelectric readout circuit is conducted when the at least a second light-emitting unit emits light, the third transmission gate is conducted when the first light-emitting unit and the at least a second light-emitting unit do not emit light, a conduction time interval of the first transmission gate is longer than an emitting time interval of the first light-emitting unit, and an conduction time interval of the at least a second transmission gate is longer than an emitting time interval of the at least a second light-emitting unit.

13. The 3D image system as claim 11, characterized in that, the light-sensing pixel circuit comprises a first reset transistor, at least a second reset transistor and a third reset transistor, the first reset transistor is coupled to the first transmission gate, the at least a second reset transistor is coupled to the at least a second transmission gate of the at least a second photoelectric readout circuit, and the third reset transistor is coupled to the third transmission gate.

14. The 3D image system as claim 11, characterized in that, a time in which the first transmission gate is conducted and a time in which the second transmission gate is conducted are separated by a time blank.

15. The 3D image system as claim 9, characterized in that, the first wavelength and the at least a second wavelength are different.

16. The 3D image system as claim 9, characterized in that, the duty cycles of the first pulse signal and the at least a second pulse signal are time variant.

17. The 3D image system as claim 1, characterized in that, the duty cycle of the first pulse signal is time variant.

18. A three-dimensional (3D) image system, characterized by, comprising:
   a structural light module, configured to emit a structural light, wherein the structural light module comprises a first light-emitting unit, the first light-emitting unit receives a first pulse signal and emits a first light according to the first pulse signal, a duty cycle of the first pulse signal is less than $1/50$, an emission power the first light-emitting unit is greater than 4 watts, and the first light has a first wavelength; and
   a light-sensing pixel array, configured to receive a reflected light corresponding to the structural light.

* * * * *